(12) United States Patent
Nakatani

(10) Patent No.: US 6,623,111 B2  
(45) Date of Patent: Sep. 23, 2003

(54) MULTILAYER PIEZOELECTRIC DEVICE AND METHOD OF PRODUCING THE SAME AND PIEZOELECTRIC ACTUATOR

(75) Inventor: Hiroshi Nakatani, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/175,032

(22) Filed: Jun. 20, 2002

(65) Prior Publication Data

US 2003/0007038 A1 Jan. 9, 2003

(30) Foreign Application Priority Data

Jul. 24, 2001 (JP) ........................................ 2001-223398  
Jul. 9, 2001 (JP) ........................................ 2001-207798

(51) Int. Cl.$^7$ ............................ B41J 2/045; H01L 41/08
(52) U.S. Cl. ........................... 347/72; 310/328; 310/366
(58) Field of Search .................. 347/68–72; 29/25.35; 310/311, 345, 348, 367, 368, 328, 366

(56) References Cited

U.S. PATENT DOCUMENTS 5,912,526 A * 6/1999 Okawa et al. ............... 310/328  
6,222,303 B1 * 4/2001 Nakamura et al. .......... 310/328

FOREIGN PATENT DOCUMENTS

JP 11-320881 11/1999

* cited by examiner

*Primary Examiner*—Judy Nguyen  
*Assistant Examiner*—An H. Do  
(74) *Attorney, Agent, or Firm*—Keating & Bennett, LLP

(57) ABSTRACT

A multilayer piezoelectric device includes a piezoelectric layered body having a driving-side external electrode and a connection-side external electrode disposed at one side surface of the piezoelectric layered body, in which a plurality of actuator units are formed by dividing the piezoelectric layered body by a slit extending from the top surface to the bottom surface of the piezoelectric layered body. A cutaway portion is provided in the one side surface of the piezoelectric layered body where the driving-side external electrode and the connection-side external electrode are located so that the cutaway portion is substantially parallel to driving internal electrodes and a connecting internal electrode. The cutaway portion has a width that allows it to reach a location above the bottom end of the slit from the bottom surface of the piezoelectric layered body but that does not allow it to reach the driving internal electrodes.

11 Claims, 17 Drawing Sheets

MULTILAYER PIEZOELECTRIC DEVICE AND METHOD OF PRODUCING THE SAME AND PIEZOELECTRIC ACTUATOR

BACKGROUND OF THE INVENTION

1. Field of the Invention

The present invention relates to a multilayer piezoelectric device and a method of producing the same. More particularly, the present invention relates to a multilayer piezoelectric device used for producing a piezoelectric actuator including a plurality of separately drivable actuator units and a method of producing the multilayer piezoelectric device, and a piezoelectric actuator including such a multilayer piezoelectric device.

2. Description of the Related Art

Conventional print heads in inkjet printers generally are driven using a piezoelectric actuator. An example of such a piezoelectric actuator is disclosed in Japanese Unexamined Patent Application Publication No. 11-320881. The piezoelectric actuator described in this publication has an external shape shown in FIG. 13 and includes a multilayer piezoelectric device 31.

The multilayer piezoelectric device 31 includes a piezoelectric layered body 37, which is a rectangular ceramic sintered body, including a driving section 34 and a connecting section 36. In the driving section 34, a plurality of first driving internal electrodes 32 and a plurality of second driving internal electrodes 33 are alternately placed upon each other through a piezoelectric layer. In the connecting section 36, a plurality of connecting internal electrodes 35 are placed upon each other through a piezoelectric layer. The piezoelectric layer of the driving section 34 is a portion that stretches and contracts along a lamination direction, called a d33 direction, in response to application of an alternating voltage thereto after it has been polarized.

As shown in FIG. 13A, which illustrates the multilayer piezoelectric device 31 viewed from one side thereof, end portions of the first driving internal electrodes 32 are exposed from only one of opposing side surfaces 37a and 37b of the piezoelectric layered body 37, that is, from only the first side surface 37a, whereas end portions of the first driving internal electrodes 32 are not exposed from the second side surface 37b. As shown in FIG. 13B, which shows the multilayer piezoelectric device 31 viewed from the other side thereof, end portions of the second driving internal electrodes 33 are exposed from the second side surface 37b, whereas end portions are not exposed from the first side surface 37a. End portions of the connecting internal electrodes 35 are exposed from both the first side surface 37a and the second side surface 37b of the piezoelectric layered body 37.

Driving-side external electrodes 38 and connection-side external electrodes 39 are each formed in parallel at the first side surface 37a of the piezoelectric layered body 37 through a gap 40 of a predetermined width. The first driving internal electrodes 32 and the connecting internal electrodes 35 are separately in electrical conduction with their corresponding external electrodes 38 and 39. A common-side external electrode 41 is disposed at the second side surface 37b of the piezoelectric layered body 37. The second driving internal electrodes 33 and the connecting internal electrodes 35 are all in electrical conduction with the common-side external electrode 41.

Here, the common-side external electrode 41 is formed over the entire second side surface 37b, while the driving-side external electrodes 38 and the connection-side external electrodes 39 are formed after providing a gap 42 of a predetermined width in the bottom portion of the first side surface 37a, that is, after being separated through the gap 42 from the bottom surface of the piezoelectric layered body 37. Therefore, as shown in FIG. 14, the driving section 34 of the multilayer piezoelectric device 31 has a cross-sectional structure such as that shown in FIG. 14.

A piezoelectric actuator 45 having an external form shown in FIG. 15 is produced using the multilayer piezoelectric device 31. More specifically, the multilayer piezoelectric device 31 is secured to a supporting substrate 46 using, for example, an adhesive, and a plurality of slits 47, which extend in a lamination direction X from the top surface to the bottom surface of the driving section 34, are formed in the driving section 34 of the piezoelectric layered body 37 of the multilayer piezoelectric device 31.

As shown in FIG. 15A, which shows the piezoelectric actuator 45 viewed from one side thereof, by dividing the first driving internal electrodes 32 and the second driving internal electrodes 33, and the driving-side external electrodes 38 by the slits 47, the driving section 34 is divided into a plurality of driving section portions in order to provide a plurality of separately drivable actuator units 48. Obviously, by these slits 47, the first driving internal electrodes 32 and the second driving internal electrodes 33 that have been placed upon each other in the driving section 34 are divided.

Here, since the driving-side external electrodes 38 are also divided, a plurality of unit external electrodes 49 corresponding to the separate actuator units 48 are formed. The portions between the connecting section 36 and the driving section 34 of the piezoelectric actuator 45 may be divided by the slits 47. FIG. 15B shows the piezoelectric actuator 45 viewed from the other side thereof.

Although not shown, a flexible printed circuit drawn out from a driving signal source, installed externally of the piezoelectric actuator 45, is connected to the piezoelectric actuator 45 including the actuator units 48. By applying alternating voltage between each unit external electrode 49 and the common-side external electrode 41, or, actually, between each unit external electrode 49 and each connection-side external electrode 39, connected to the common-side external electrode 41 through each connecting internal electrode 35, each actuator unit 48 is driven.

As described above, in the multilayer piezoelectric device 31 used for producing the piezoelectric actuator 45, the driving-side external electrodes 38 and the connection-side external electrodes 39 are disposed at the first side surface 37a of the piezoelectric layered body 37, and the common-side external electrode 41 is disposed at the second side surface 37b of the piezoelectric layered body 37. As shown in FIG. 16, when forming these external electrodes 38, 39, and 41, a deposition mask 50 for completely covering portions of the piezoelectric layered body 37 other than the side surfaces 37a and 37b is provided. After placing the piezoelectric layered body 37 inside the deposition mask 50, an electrode formation process, that is, evaporation or sputtering, is carried out. The arrows shown in FIG. 16 indicate the directions of film deposition.

However, when the piezoelectric layered body 37 is placed inside the deposition mask 50, a gap 51 is formed between them, and the deposition mask 50 undergoes thermal deformation at the time of film deposition, so that a film-deposition precision of the order of only ±0.1 mm can be obtained. As shown in FIG. 14, the driving-side external electrodes 38 and the connection-side external electrodes 39, disposed at the first side surface 37a of the multilayer piezoelectric device 31 having a height H of 1.0 mm, need to be separated from the bottom surface of the piezoelectric layered body 37 through the gap 42 having a width W of 0.1 mm. Therefore, problems such as those described below arise.

Since a high film-deposition precision cannot be achieved, the width W of the gap 42 becomes large or small, so that the heights of the locations where the driving-side external electrodes 38 and the connection-side external electrodes 39 are disposed become large or small. When the heights of the portions where the driving-side external electrodes 38 are disposed become large, so that the width W of the gap 42 becomes too large, the external electrodes 38 and the first driving internal electrodes 32 may not be in electrical conduction with each other as shown in FIG. 17, so that faulty electrical continuity results.

On the other hand, when the heights of the portions where the driving-side external electrodes 38 are disposed become too small, as shown in FIG. 18, the driving-side external electrodes 38 are not sufficiently divided by the slits 47 used for producing the piezoelectric actuator 45, so that short circuits occur between the unit external electrodes 49. To overcome such problems which must be solved, it is possible to make it difficult for faulty electrical continuity or a short circuit to occur even if good film-deposition precision in the height direction is not achieved by setting a large separation distance (at a lower external layer portion) between the bottom surface of the piezoelectric layered body 37 of the multilayer piezoelectric device 31 and the bottommost ones of the driving internal electrodes 32 and 33.

However, when such a structure is used, not only does the multilayer piezoelectric device 31 become large as a result of increasing the thickness of the lower external layer portion thereof, but also mechanical processability is greatly reduced because it is necessary to cut the slits 47 deeply. In addition, cracks tend to be produced from the thick lower external layer portion, so that the multilayer piezoelectric device 31 tends to be damaged.

Further, in the multilayer piezoelectric device 31, the driving-side external electrodes 38 and the connection-side external electrodes 39 are formed flush with the side surface 37a of the piezoelectric layered body 37, so that, as shown in FIG. 19, a fillet 52 of an adhesive used for securing the multilayer piezoelectric device 31 to the supporting substrate 46 oozes out to the surface of the driving-side external electrodes 38 and the connection-side external electrodes 39 due to surface tension. When the fillet 52 of the adhesive sticks onto the external electrodes 38 and 39, it becomes difficult for solder to stick when soldering a flexible printed circuit to the unit external electrodes 49 and the connection-side external electrodes 39.

SUMMARY OF THE INVENTION

In order to overcome the problems described above, preferred embodiments of the present invention provide a multilayer piezoelectric body, and a method producing the same, which is constructed so that faulty electrical continuity between an external electrode and a driving internal electrode and a short circuit at the external electrode do not occur, and so that a fillet of an adhesive does not ooze out to the surface of the external electrode.

According to a first preferred embodiment of the present invention, a multilayer piezoelectric device includes a piezoelectric layered body including a driving section where first driving internal electrodes and second driving internal electrodes are alternately placed upon each other through a piezoelectric layer and a connecting section where connecting internal electrodes are placed upon each other through a piezoelectric layer, in which at least a driving-side external electrode and a connection-side external electrode, which are in electrical conduction with the first driving internal electrodes and the connecting internal electrodes, respectively, are arranged substantially in parallel at one of opposing side surfaces of the piezoelectric layered body, and in which at least a common-side external electrode, which is in electrical conduction with the second driving internal electrodes and the connecting internal electrodes, is disposed at the other side surface of the piezoelectric layered body. In the multilayer piezoelectric device, a plurality of separately drivable actuator units are defined by a slit that divides the driving internal electrodes of the driving section and that extends along a lamination direction from a top surface to a bottom surface of the driving section. In addition, a cutaway portion is formed in the one side surface of the piezoelectric layered body where the driving-side external electrode and the connection-side external electrode are arranged in parallel so that the cutaway portion is substantially parallel to the driving internal electrodes and the connecting internal electrodes, with the cutaway portion having a depth that allows the cutaway portion to extend from a bottom surface of the piezoelectric layered body to a location above a bottom end of the slit but does not allow the cutaway portion to reach the driving internal electrodes.

In this preferred embodiment, a cutaway portion is disposed in one side surface of the piezoelectric layered body of the multilayer piezoelectric device so as to be substantially parallel to the driving internal electrodes and the connecting internal electrodes, with the cutaway portion having a depth which allows it to extend from the bottom surface of the piezoelectric layered body to a location above the bottom end of the slit, but does not allow it to reach the driving internal electrodes of the driving section. In addition, the driving-side external electrode and the connection-side external electrode are disposed at portions of one side surface of the piezoelectric layered body excluding the cutaway portion. More specifically, in the multilayer piezoelectric device, the connection-side external electrode and the driving-side external electrode, which define a unit external electrode of the piezoelectric actuator, are arranged so as to be reliably separated by a predetermined interval from the bottom surface of the piezoelectric layered body through the cutaway portion, that is, by an interval which matches the depth of the cutaway portion.

Therefore, the heights of the portions where the driving-side external electrode and the connection-side external electrode are disposed are not increased or decreased, so that faulty electrical continuity between the external electrodes and the driving internal electrodes and a short circuit between unit external electrodes do not occur. When a cutaway portion is formed in one side surface of the piezoelectric layered body, a fillet of an adhesive for securing the multilayer piezoelectric device to a supporting substrate accumulates inside the cutaway portion, thereby providing the advantage that the fillet does not ooze out to the surface of the driving-side external electrode and the connection-side external electrode.

According to a second preferred embodiment of the present invention, a method of producing the above-described multilayer piezoelectric device of the first preferred embodiment includes the steps of producing a parent substrate where a plurality of piezoelectric layered bodies to be separated by a dividing process are continuously formed in parallel, forming cut-in grooves, which define a plurality of cutaway portions of the corresponding piezoelectric layered bodies, in corresponding areas, which become the piezoelectric layered bodies formed at the parent substrate, separating the piezoelectric layered bodies by dividing the parent substrate, and after supporting the separated piezoelectric layered bodies in a tilted state with respect to an evaporation source or a sputtering source, forming the driving-side external electrode and the connection-side external electrode by evaporation or sputtering.

According to a third preferred embodiment of the present invention, a method of producing the above-described multilayer piezoelectric device of the first preferred embodiment includes the steps of placing upon each other in a lamination direction a plurality of piezoelectric layered bodies that have been separated by dividing a parent substrate where the piezoelectric layered bodies are continuously formed in parallel, forming the driving-side external electrode and the connection-side external electrode on each of the piezoelectric layered bodies, and forming cut-in grooves, which define cutaway portions of the corresponding piezoelectric layered bodies, in the corresponding piezoelectric layered bodies that have been placed upon each other.

According to a fourth preferred embodiment of the present invention, a method of producing the above-described multilayer piezoelectric device of the first preferred embodiment includes the steps of placing upon each other in the lamination direction a plurality of piezoelectric layered bodies that have been separated by dividing a parent substrate where the piezoelectric layered bodies are continuously formed in parallel, forming cut-in grooves, which become cutaway portions of the corresponding piezoelectric layered bodies, in the corresponding piezoelectric layered bodies that have been placed upon each other, and after supporting the piezoelectric layered bodies in a tilted state with respect to an evaporation source or a sputtering source, forming the driving-side external electrode and the connection-side external electrode by evaporation or sputtering.

When any one of the methods of producing the multilayer piezoelectric device is used, the cutaway portions of the piezoelectric layered bodies of the multilayer piezoelectric device of the first preferred embodiment can be very easily formed. In addition, the driving-side external electrode and the connection-side external electrode to be formed over the entire one side surface of each piezoelectric layered body excluding the cutaway portion can be formed simultaneously on the piezoelectric layered bodies.

According to a fifth preferred embodiment of the present invention, a piezoelectric actuator which is produced using the multilayer piezoelectric device of the first preferred embodiment includes a plurality of separately drivable actuator units that are formed by dividing the first driving internal electrodes and the second driving internal electrodes placed upon each other in the driving section by the slit. The driving section of the piezoelectric device is divided by the slit extending along the lamination direction from the top surface to the bottom surface of the driving section.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A description of preferred embodiments will be given with reference to the drawings.

Figure 1A:
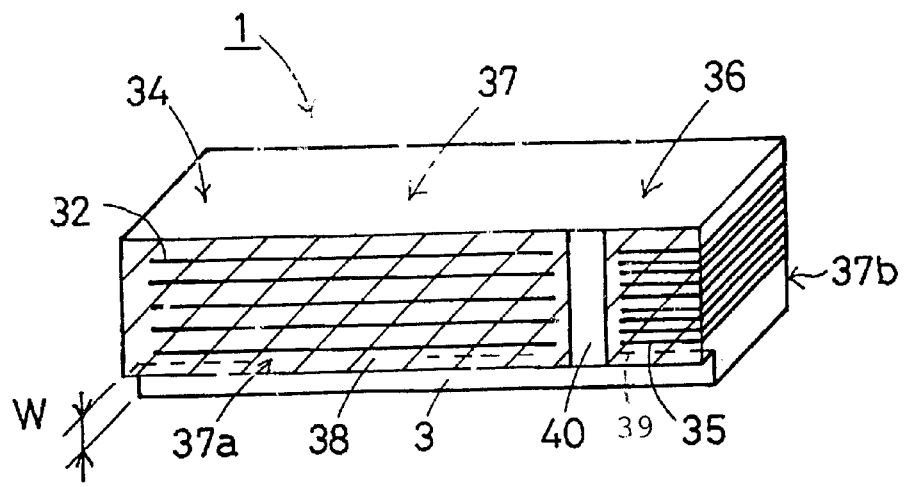
FIGS. 1A and 1B are perspective views of the external form of a multilayer piezoelectric device according to a preferred embodiment of the present invention.
Figure 1B:
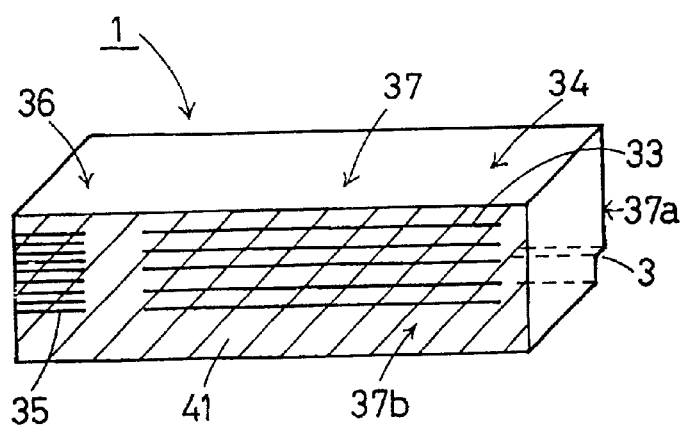
Figure 2:
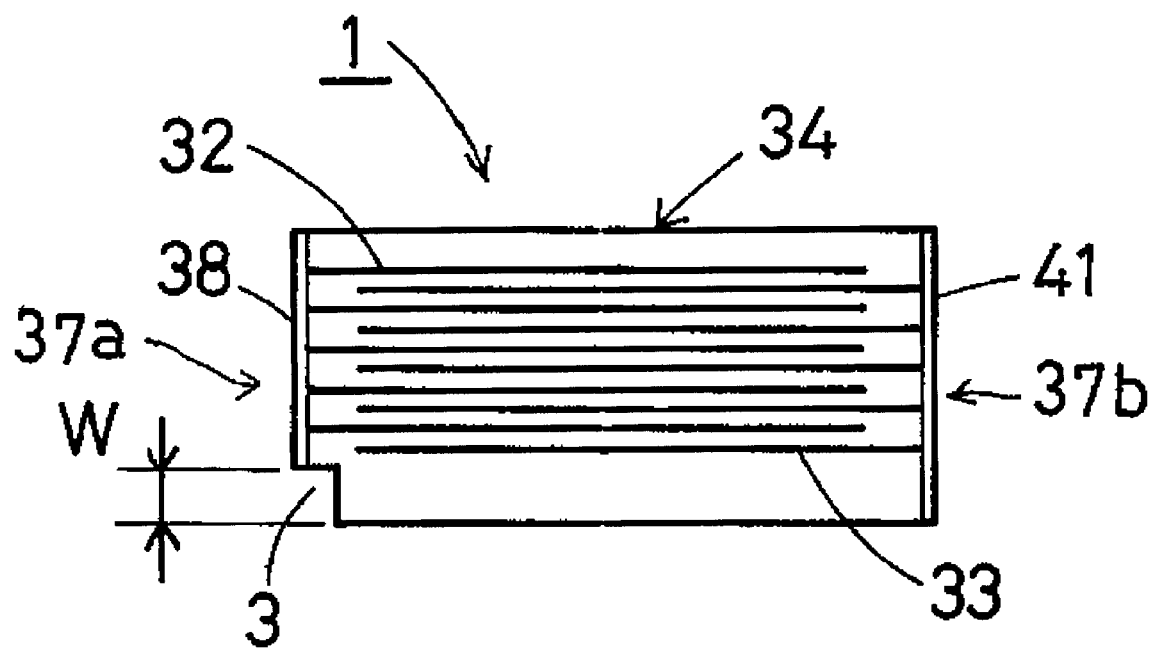
FIG. 2 is a horizontal sectional view of the structure of a driving section of the multilayer piezoelectric device according to a preferred embodiment of the present invention.
Figure 3A:
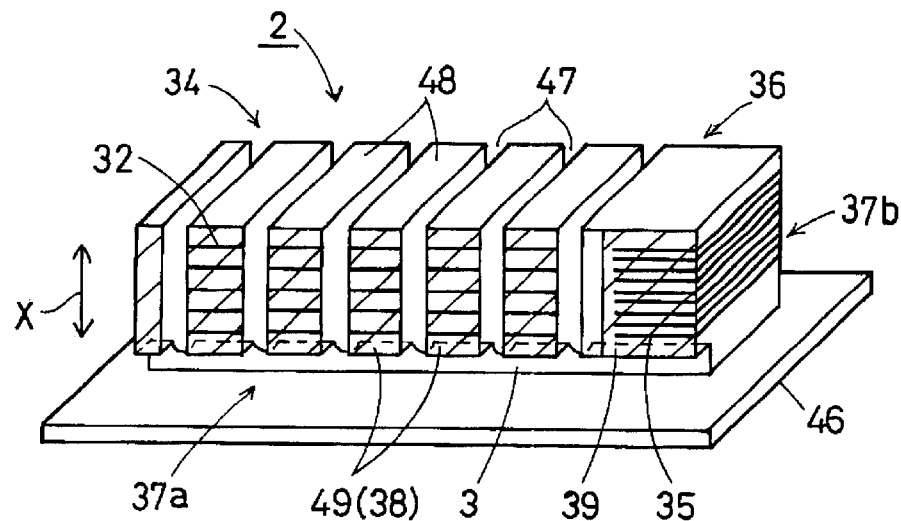
FIGS. 3A and 3B are perspective views of the external form of a piezoelectric actuator which is produced using the multilayer piezoelectric device according to a preferred embodiment of the present invention.
Figure 3B:
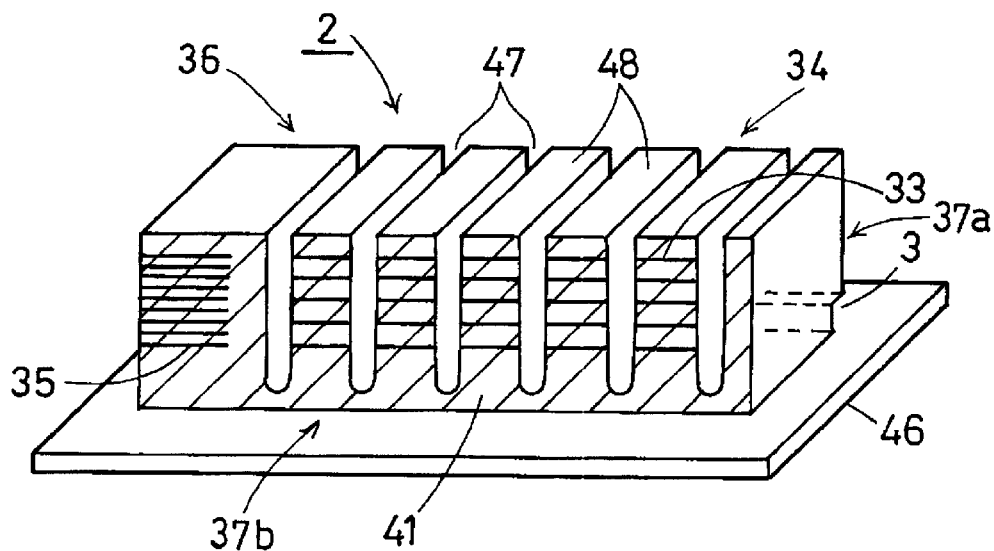
Figure 4:
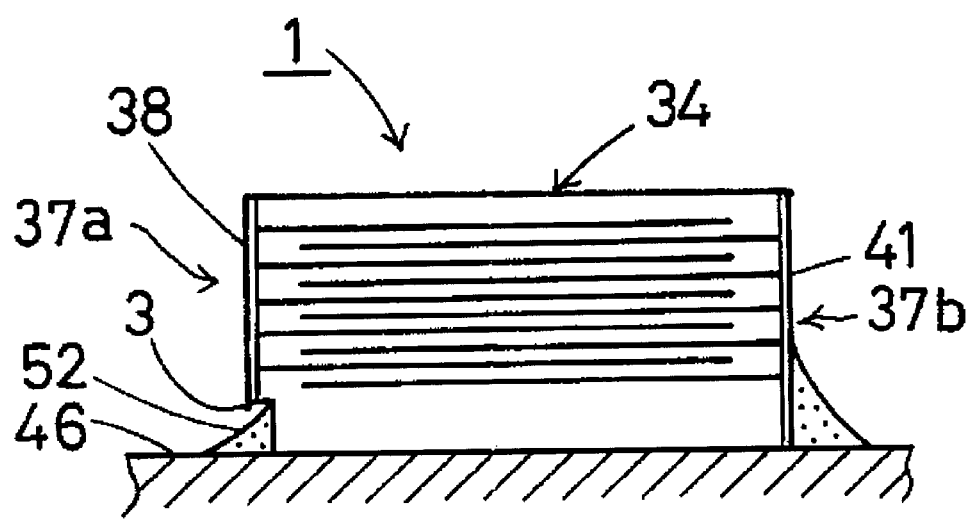
FIG. 4 is a horizontal sectional view showing a state in which the multilayer piezoelectric device according to a preferred embodiment of the present invention is secured to a supporting substrate.

FIGS. 1A and 1B are perspective views of the external form of a multilayer piezoelectric device according to a preferred embodiment of the present invention. FIG. 2 is a horizontal sectional view of the structure of a driving section of the multilayer piezoelectric device of the present preferred embodiment. FIGS. 3A and 3B are perspective views of the external form of a piezoelectric actuator which is produced using the multilayer piezoelectric device of FIGS. 1A and 1B. FIG. 4 is a horizontal sectional view showing a state in which the multilayer piezoelectric device of the present preferred embodiment is secured to a supporting substrate. In FIGS. 1 to 4, reference numeral 1 denotes a multilayer piezoelectric device, reference numeral 2 denotes a piezoelectric actuator, and reference numeral 3 denotes a cutaway portion.

The overall structures of the piezoelectric actuator 2 and the multilayer piezoelectric device 1 of the various preferred embodiments differ from those of the related examples described above in that the cutaway portion 3 is provided. In FIGS. 1 to 4, component parts that are the same as or that correspond to those shown in FIGS. 13 to 19 are indicated with the same reference numerals.

As shown in FIGS. 1A and 1B, the multilayer piezoelectric device 1 of the present preferred embodiment includes a piezoelectric layered body 37, which is preferably a substantially rectangular ceramic sintered body, including a driving section 34 and a connecting section 36. In the driving section 34, first driving internal electrodes 32 and second driving internal electrodes 33 are alternately placed upon each other through a piezoelectric layer. In the connecting section 36, a plurality of connecting internal electrodes 35 are placed upon each other through a piezoelectric layer. As shown in FIG. 1A, which illustrates the multilayer piezoelectric device 1 viewed from one side thereof, end portions of the first driving internal electrodes 32, placed upon each other in the driving section 34, are exposed from only one of opposing side surfaces 37a and 37b of the piezoelectric layered body 37, that is, from only the first side surface 37a, so that end portions of the first driving internal electrodes 32, placed upon each other in the driving section 34, are not exposed from the second side surface 37b. Here, although the connecting section 36 is disposed at only one side of the piezoelectric layered body 37, the connecting section 36 may be provided at both sides of the piezoelectric layered body 37 with the driving section 34 disposed therebetween.

As shown in FIG. 1B, which shows the multilayer piezoelectric device 1 viewed from the other side thereof, end portions of the second driving internal electrodes 33 are exposed from only the second side surface 37b, so that end portions are not exposed from the first side surface 37a. Both end portions of each of the connecting internal electrodes 35 are exposed from the first and second side surfaces 37a and 37b of the piezoelectric layered body 37. Driving-side external electrodes 38 and connection-side external electrodes 39 are disposed substantially in parallel at the first side surface 37a through a gap 40 of a predetermined width. The first driving internal electrodes 32 and the connecting internal electrodes 35 are separately in electrical conduction with the external electrodes 38 and 39.

A cutaway portion 3 is formed along the bottom edge of the first side surface 37a of the piezoelectric layered body 37 where the driving-side external electrodes 38 and the connection-side external electrodes 39 are disposed. The cutaway portion 3 has a width W that allows it extend above the bottom ends of slits 47 from the bottom surface of the piezoelectric layered body 37, that is, to extend to a location above the top sides of the bottom ends of the slits 47 that are formed when the piezoelectric actuator 2 is being produced using the multilayer piezoelectric device 1. However, the width W of the cutaway portion 3 does not allow it to reach the bottom most layers of the driving internal electrodes 32 and 33, which are placed upon each other in the driving section 34. The cutaway portion 3 is substantially parallel to each of the driving internal electrodes 32 and 33 and connecting internal electrodes 35 placed upon each other at the piezoelectric layered body 37.

More specifically, the connection-side external electrodes 39 and the driving-side external electrodes 38 are arranged at the first side surface 37a so as to be reliably separated by a predetermined interval from the bottom surface of the piezoelectric layered body 37 through the cutaway portion 3, that is, by an interval which matches the depth W of the cutaway portion 3. Therefore, the heights of the locations where the driving-side external electrodes 38 and the connection-side external electrodes 39 are formed are not increased or decreased, so that faulty electrical continuity between the driving-side external electrodes 38 and the first driving internal electrodes 32 and the connection-side external electrodes 39 and the connecting internal electrodes 35 does not occur.

A common-side external electrode 41 is disposed to cover the entire second side surface 37b of the piezoelectric layered body 37 used here. The second driving internal electrodes 33 and the connecting internal electrodes 35 are all in electrical conduction with the common-side external electrode 41. Accordingly, the connection-side external electrodes 39, disposed at the first side surface 37a, are connected to the common-side external electrode 41 through the connecting internal electrodes 35 placed upon each other in the connecting section 36 of the piezoelectric layered body 37. As a result, the driving section 34 of the multilayer piezoelectric device 1 of the present preferred embodiment has the cross-sectional structure shown in FIG. 2.

Using the multilayer piezoelectric device 1 and by following the same procedures as those for the related example, the piezoelectric actuator 2 having an external form shown in FIG. 3 is produced. More specifically, the piezoelectric actuator 2 is constructed so that the driving section 34 of the multilayer piezoelectric device 1, secured to a supporting substrate 46 using an adhesive or other suitable joining means, is divided by slits 47 formed in a lamination direction X from the top surface to the bottom surface of the driving section 34. Since the first and second driving internal electrodes 32 and 33, placed upon each other in the driving section 34, are divided by the slits 47, a plurality of separately drivable actuator units 48 are defined in the driving section 34.

Since the cutaway portion 3 is provided in the first side surface 37a of the piezoelectric layered body 37 of the multilayer piezoelectric device 1, as shown in FIG. 4, a fillet 52 of an adhesive that secures the multilayer piezoelectric device 1 to the supporting substrate 46 accumulates inside the cutaway portion 3, so that it does not ooze out to the surface of the driving-side external electrodes 38 and the connection-side external electrodes 39. As shown in FIG. 3A, which illustrates the piezoelectric actuator 2 viewed from one side thereof, since the driving-side external electrodes 38 are also divided by the slits 47, a plurality of unit external electrodes 49 corresponding to the separated actuator units 48 are provided.

Portions between the connecting section 36 and the driving section 34 of the piezoelectric actuator 2 may be divided by the slits 47. FIG. 3B shows the piezoelectric actuator 2 viewed from the other side thereof.

Although not shown, a flexible printed circuit drawn out from a driving signal source, which is installed externally of the piezoelectric actuator 2, is connected to the piezoelectric actuator 2 including the actuator units 48. Alternating voltage is applied between each unit external electrode 49 and the common-side external electrode 41, or, actually, between each unit external electrode 49 and the connection-side external electrodes 39, connected to the common-side external electrode 41 through the connecting internal electrodes 35. As a result, each actuator unit 48 of the piezoelectric actuator 2 is separately driven as in the related example.

Figure 5:
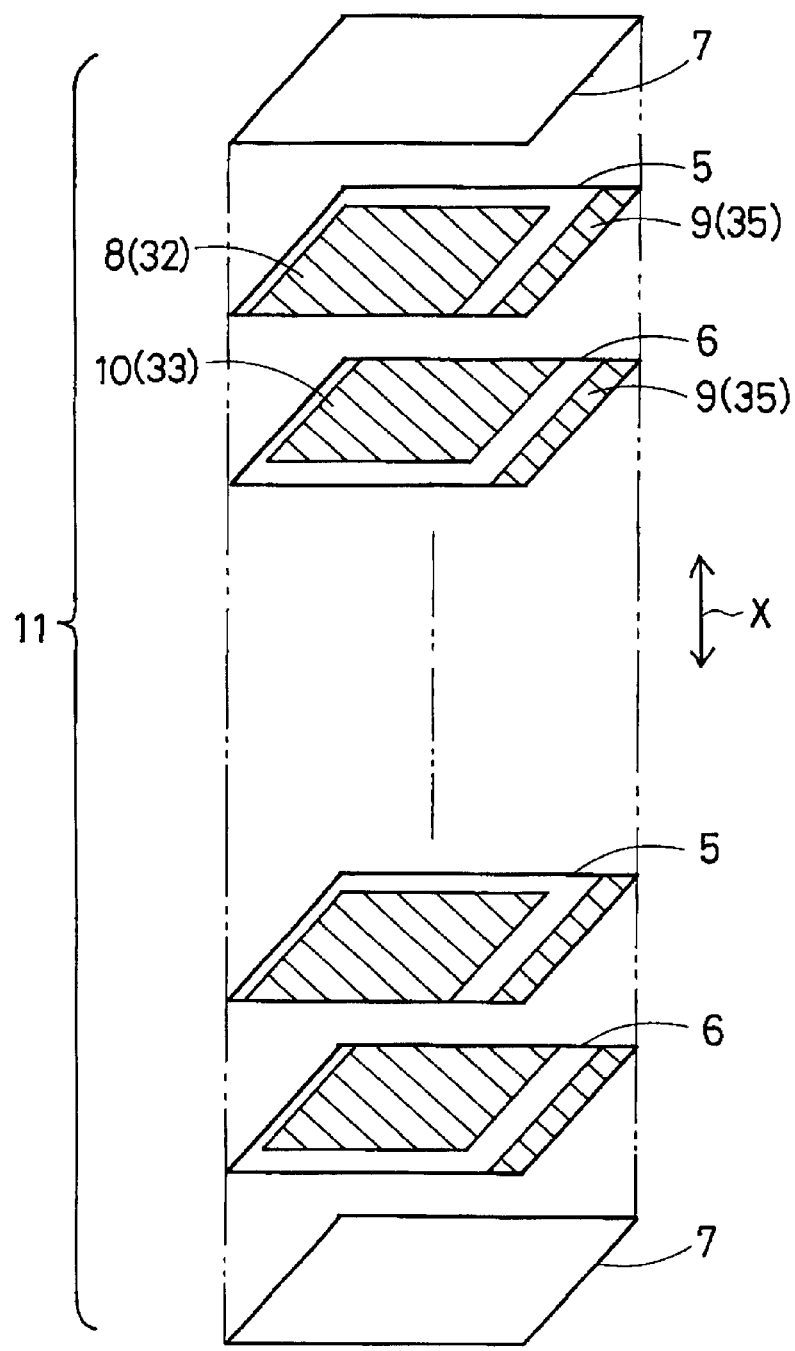
FIG. 5 is an exploded perspective view illustrating a method of producing a piezoelectric layered body of the multilayer piezoelectric device according to a preferred embodiment of the present invention.
Figure 6:
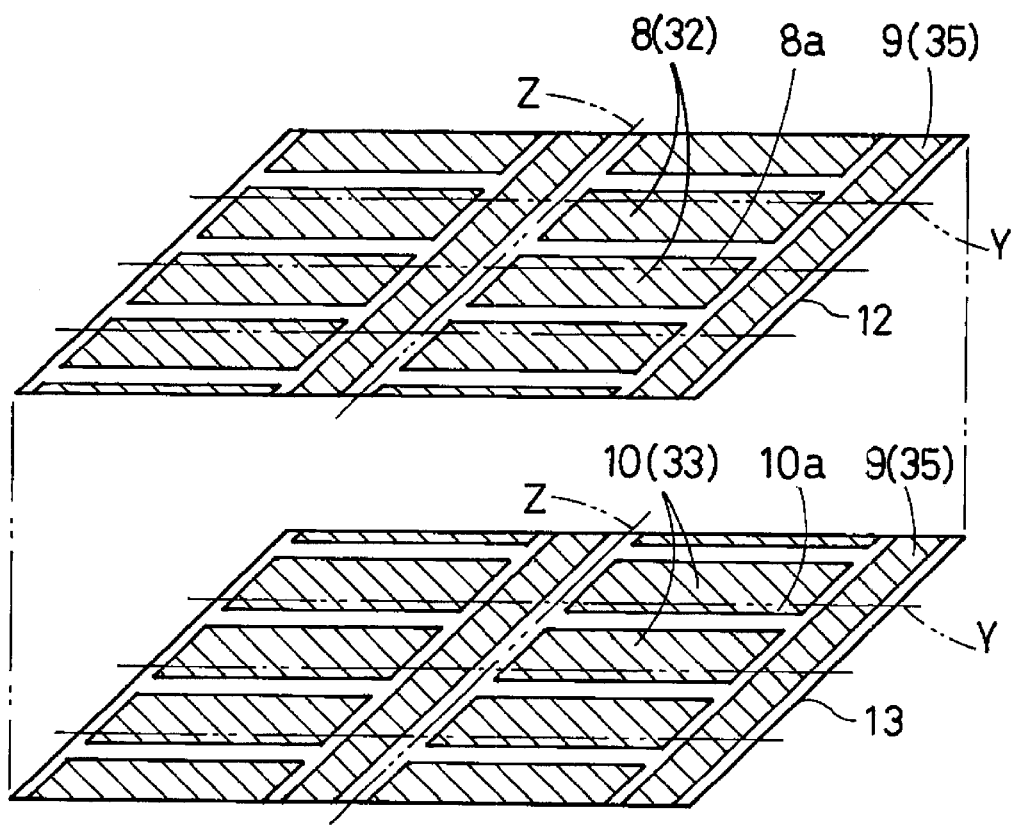
FIG. 6 is an exploded perspective view showing a method of producing a plurality of piezoelectric layered bodies simultaneously according to a preferred embodiment of the present invention.
Figure 7:
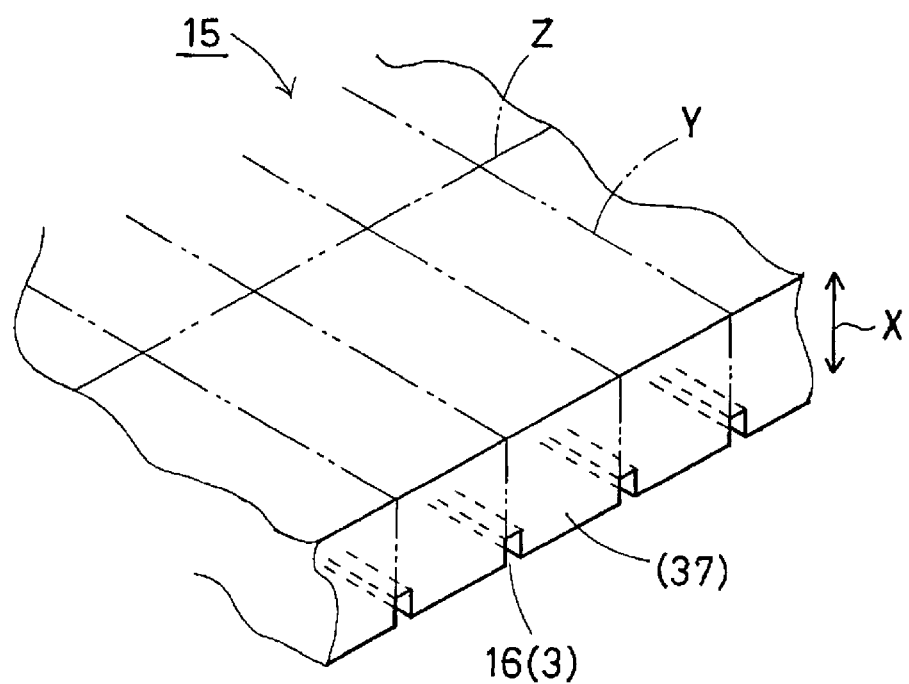
FIG. 7 is an external perspective view showing the main portion of a parent substrate where the piezoelectric layered bodies are continuously formed in parallel.
Figure 8:
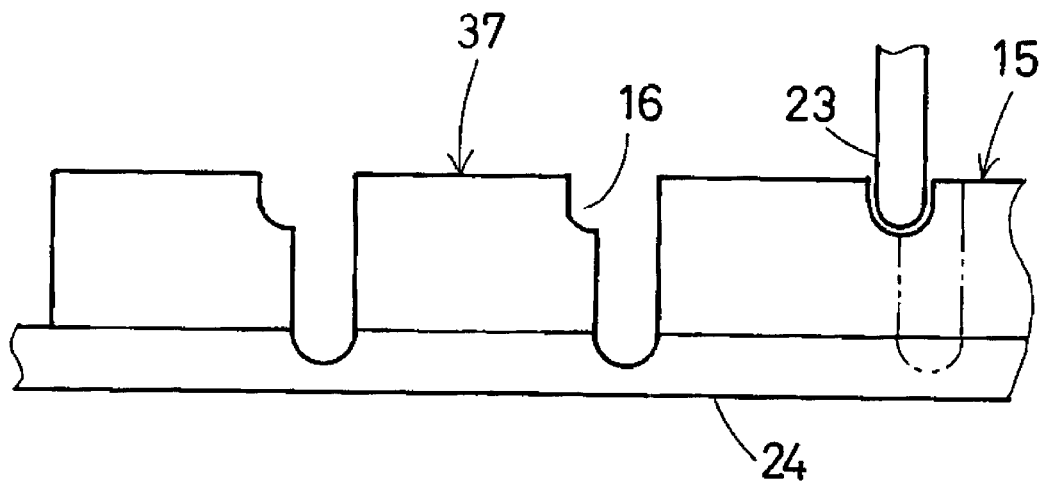
FIG. 8 is a sectional view of the main portion of the parent substrate for illustrating a modification of the method of dividing the parent substrate.
Figure 9:
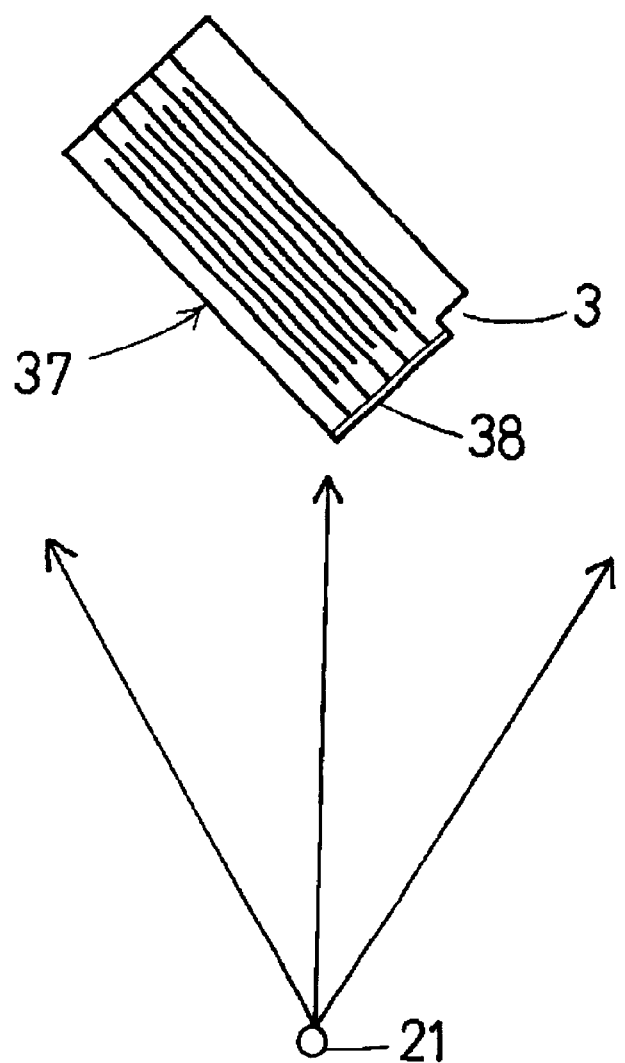
FIG. 9 illustrates a method of forming driving-side external electrodes and connection-side external electrodes in the multilayer piezoelectric device according to a preferred embodiment of the present invention.

Next, a method of producing the multilayer piezoelectric device 1 of the preferred embodiment described above will be described with reference to FIGS. 5 to 9. FIG. 5 is an exploded perspective view illustrating a method of producing a piezoelectric layered body itself of the multilayer piezoelectric device. FIG. 6 is an exploded perspective view showing a method of producing a plurality of piezoelectric layered bodies simultaneously. FIG. 7 is an external perspective view showing the main portion of a parent substrate where the piezoelectric layered bodies are continuously formed in parallel. FIG. 8 is a sectional view of the main portion of the parent substrate for illustrating a modification of the method of dividing the parent substrate. FIG. 9 illustrates a method of forming driving-side external electrodes and connection-side external electrodes in the multilayer piezoelectric device.

In producing the piezoelectric layered body 37 of the multilayer piezoelectric device 1, first, three types of green sheets 5, 6, and 7 shown in FIG. 5 are provided. More specifically, there are provided the green sheet 5 where an electrically conductive pattern 8 (which defines the first driving internal electrodes 32) and an electrically conductive pattern 9 (which defines the corresponding connecting internal electrodes 35) are formed, the green sheet 6 where an electrically conductive pattern 10 (which becomes the second driving internal electrodes 33) and an electrically conductive pattern 9 (which becomes the corresponding connecting internal electrodes 35), and the green sheet 7 that does not have any patterns formed thereon.

These green sheets 5, 6, and 7 are preferably formed of piezoelectric materials, such as PZT materials, that are formed into substantially rectangular shapes in plan view. The electrically conductive patterns 8, 9, and 10 are preferably formed by screen printing electrically conductive paste having a main component of, for example, silver (Ag). The electrically conductive pattern 8 has a form where one-side end portion thereof reaches one long side of the green sheet 5 and the other-side end portion thereof does not reach the other long side of the green sheet 5.

The electrically conductive patterns 9 have forms where both side end portions thereof reach both long sides of the green sheets 5 and 6. The electrically conductive pattern 10 has a form where one side end portion thereof does not reach one long side of the green sheet 6 and the other side end portion thereof reaches the other long side of the green sheet 6. The electrically conductive patterns 8 and 9 may be formed by slightly shifting the positions of patterns having the same forms.

When a predetermined number of the provided green sheets 5, 6, and 7 are repeatedly alternately placed upon each other in the order such as that shown in FIG. 5, and the green sheets 5, 6, and 7 are press-bonded all together along the lamination direction X, an unbaked layered-body block 11 is formed. End portions of the electrically conductive patterns 8 and 10 are exposed from one of opposing side surfaces of the layered-body block 11, while end portions of the electrically conductive patterns 9 and 10 are exposed from the other side surface of the layered-body block 11. Thereafter, when the layered-body block 11 is subjected to baking, the piezoelectric layered body 37 is produced.

The method of producing the piezoelectric layered body 37, described with reference to FIG. 5, is used when producing piezoelectric layered bodies 37 one at a time. Actually, a plurality of piezoelectric layered bodies 37 are produced simultaneously by following the procedures described below. More specifically, as shown in FIG. 6, first, there are provided a large-area green sheet 12 having a plurality of sets of electrically conductive patterns 8 and 9 formed substantially in parallel thereon and a large-area green sheet 13 having a plurality of sets of electrically conductive patterns 9 and 10 formed substantially in parallel thereon. Then, when a predetermined number of green sheets 12 and 13 are alternately placed upon each other and, then, press-bonded along the lamination direction, a parent substrate block which is in an unbaked state and which has a size corresponding to a plurality of layered-body blocks 11 disposed substantially in parallel are produced.

Thereafter, when the produced parent substrate block is subjected to baking, for example, a parent substrate 15 having the piezoelectric layered bodies 37 that are separated by a dividing process and that are formed continuously in parallel is produced as shown in FIG. 7 (which shows only the main portion of the parent substrate 15). Then, when the top and bottom surfaces of the produced parent substrate 15 is flattened by lapping or by surface grinding, and the parent substrate 15 is divided along predetermined division lines Y and Z that separate each area that corresponds to each of the individual piezoelectric layered bodies 37, the individual piezoelectric layered bodies 37 that have been separated by the dividing process are obtained. The double-headed arrow X in FIG. 7 denotes the lamination direction.

When the green sheets 12 and 13 shown in FIG. 6 are placed upon each other and the resulting layered structure is divided after the baking process, as indicated in FIG. 6, the division lines Y and Z are sometimes displaced from their target locations. As a result, electrode portions (not shown) including division end portions 8a and 10a of corresponding adjacent electrically conductive patterns 8 and 10 are sometimes formed at the inside portions of the piezoelectric layered bodies 37. However, from a practical standpoint, the formation of such electrode portions do not cause any inconvenience.

Here, in the method of producing the multilayer piezoelectric device according to a preferred embodiment of the present invention, prior to the dividing of the parent substrates 15, cut-in grooves 16 of predetermined depths W, which become cutaway portions 3 of the corresponding piezoelectric layered bodies 37, are formed in corresponding areas that become the piezoelectric layered bodies 37 by dicing or other separation process. After forming these cut-in grooves 16, the parent substrate 15 is divided by, for example, a dicer or a wire saw, or other suitable device, in order to produce the individual piezoelectric layered bodies 37. Therefore, the cutaway portions 3 are formed along the bottom edges of the first side surfaces 37a of the corresponding piezoelectric layered bodies 37.

Since the dicing carried out to form the cut-in grooves 16 is of good height-direction cutting precision at about ±10 $\mu$m, when the grooves 16 are formed by dicing, the precision with which the cutaway portions 3 are formed in the piezoelectric layered bodies 37 is very good. If the precision with which the cutaway portions 3 is formed is good, the lower external layer portions of the piezoelectric layered bodies 37 can be thinner than in the related example by a value of about 200 μm. Therefore, the multilayer piezoelectric device 1 can be made very small.

Here, although the cut-in grooves 16 are formed in the corresponding areas that become the piezoelectric layered bodies 37 prior to dividing the parent substrate 15, other procedures may be used. For example, a procedure such as that illustrated in FIG. 8 (which shows a modification of the method of dividing the parent substrate 15) may be carried out. More specifically, in the modification, when the parent substrate 15 is divided, after forming the cut-in grooves 16 of the predetermined depths W, which define the cutaway portions 3, in the corresponding areas that become the piezoelectric layered bodies 37 using a dicing blade 23, the dicing blade 23 is slightly displaced horizontally in order to divide the parent substrate 15 by full cutting. In FIG. 8, reference numeral 24 denotes a dicing tape, which is used to support the undivided parent substrate 15 and the divided layered bodies 37.

Thereafter, as shown in FIG. 9, after the separated piezoelectric layered bodies 37 which have been tilted by predetermined angles have been supported, when materials suitable for forming the external electrodes are adhered to the first surfaces 37a of the piezoelectric layered bodies 37 by evaporation, the driving-side external electrodes 38 and the connection-side external electrodes 39 that are in electrical conduction with the first driving internal electrodes 32 and the connection internal electrodes 35 are formed. More specifically, in the piezoelectric layered bodies 37 at this time, the cutaway portions 3 are moved away from an evaporation source 21 and the first side surfaces 37a are supported in a tilted state so as to face the evaporation source 21. Here, although the evaporation source 21 has the form of a point, the form of the evaporation source 21 is not limited thereto, so that, it may have a planar form.

When the first side surfaces 37a are in a tilted state, the cutaway portions 3 are hidden from the evaporation source 21 by the first side surfaces 37a of the piezoelectric layered bodies 37, so that electrodes are not formed at the cutaway portions 3. After forming the common-side external electrode 41 at each second side surface 37b opposing its corresponding first side surface 37a where the driving-side external electrodes 38 and the connection-side external electrodes 39 are formed, when a voltage is applied between the driving-side external electrodes 38 and the connection-side external electrodes 39 in order to polarize the piezoelectric layers of the driving sections 34, the multilayer piezoelectric devices 1 of the present preferred embodiment are completed. Each of the external electrodes 38, 39, and 41 does not have to be formed by evaporation, so that, they may be formed by sputtering, or other suitable process.

Figure 10:
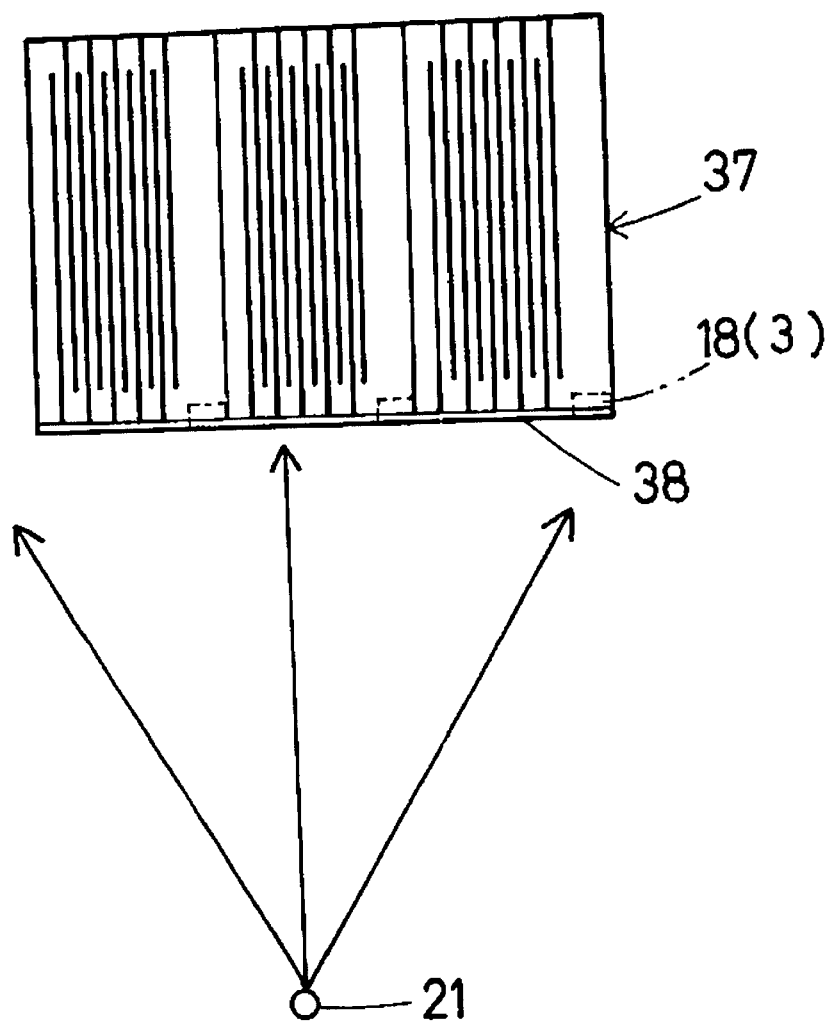
FIG. 10 illustrates another method of forming the driving-side external electrodes and the connection-side external electrodes in the multilayer piezoelectric device according to a preferred embodiment of the present invention.
Figure 11:
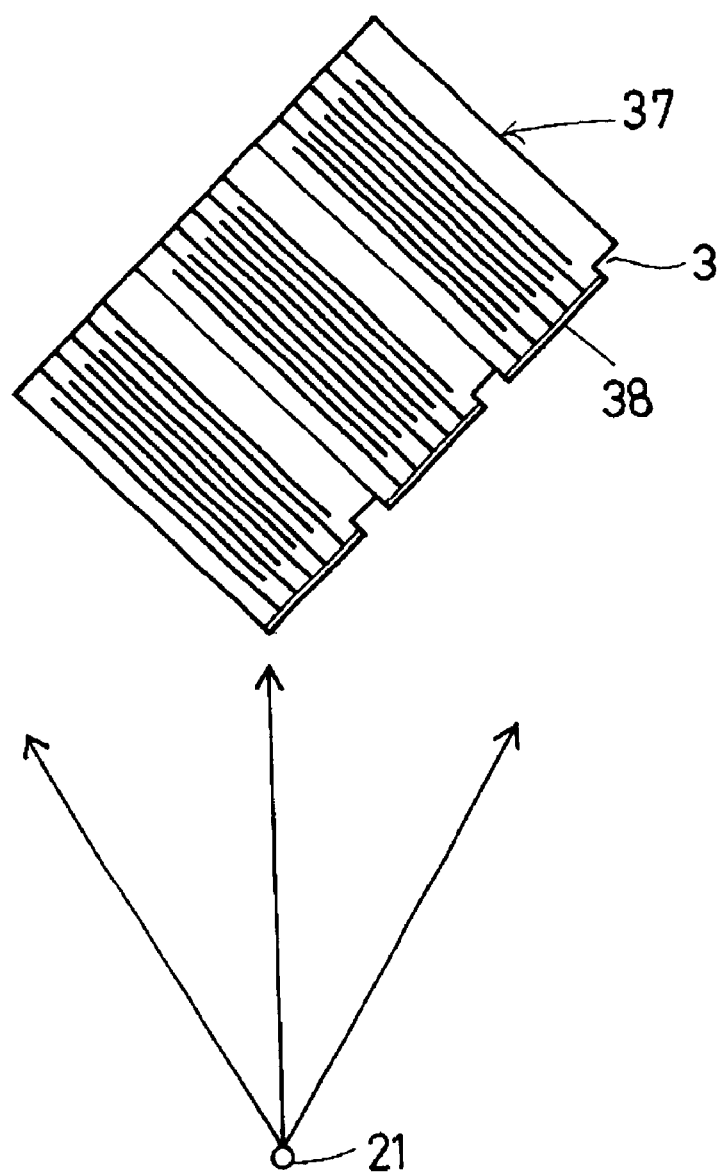
FIG. 11 illustrates still another method of forming the driving-side external electrodes and the connection-side external electrodes in the multilayer piezoelectric device according to a preferred embodiment of the present invention.
Figure 12:
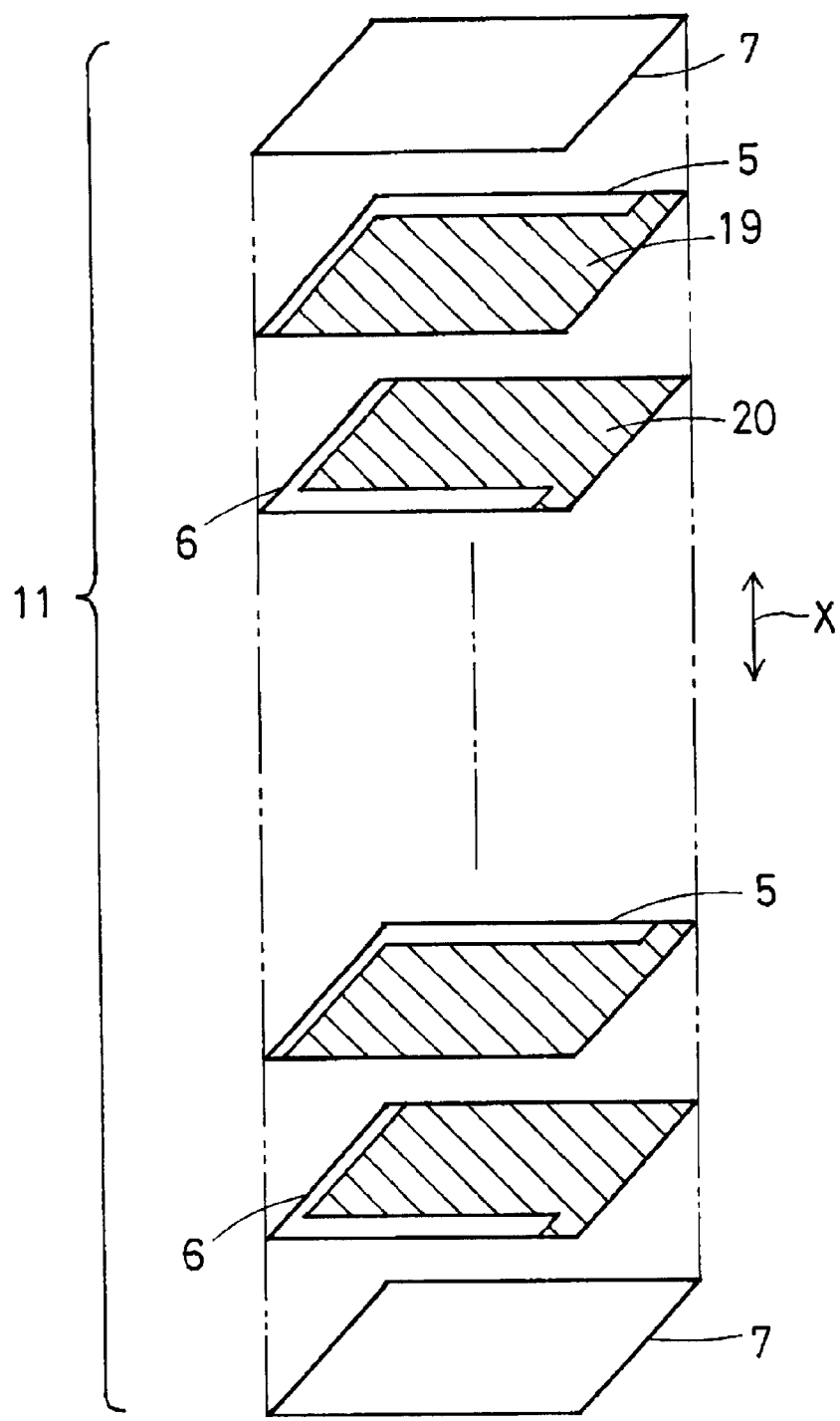
FIG. 12 is an exploded perspective view of another method of producing a piezoelectric layered body according to a preferred embodiment of the present invention.
Figure 13A:
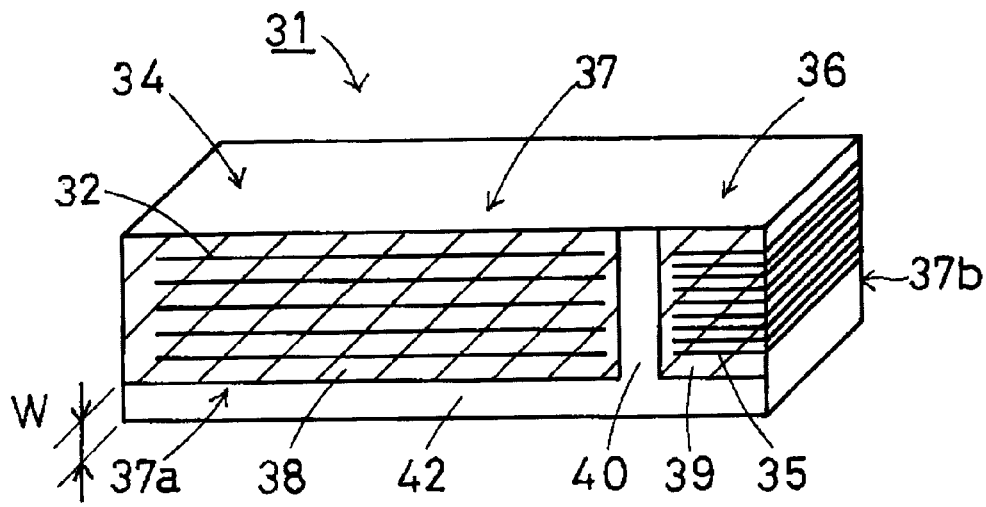
FIGS. 13A and 13B are perspective views of an external form of a conventional multilayer piezoelectric device.
Figure 13B:
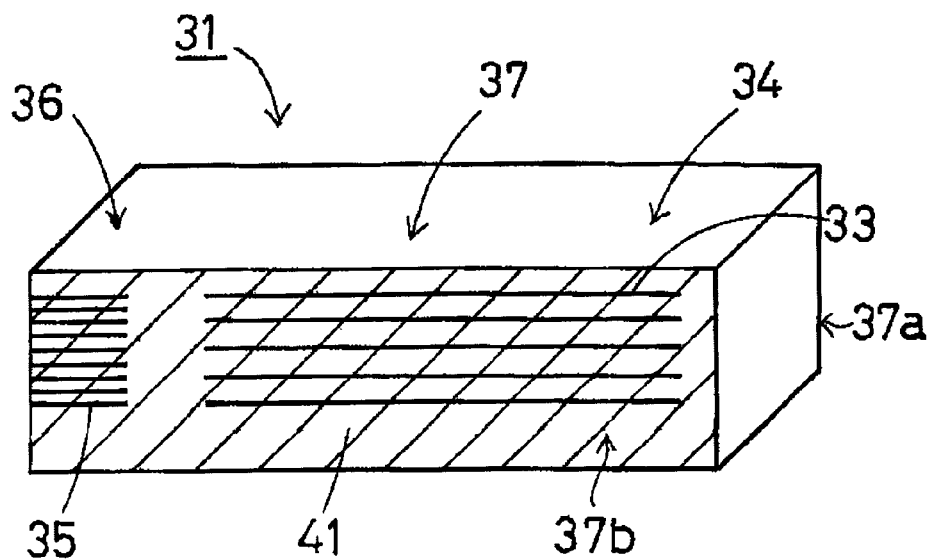
Figure 14:
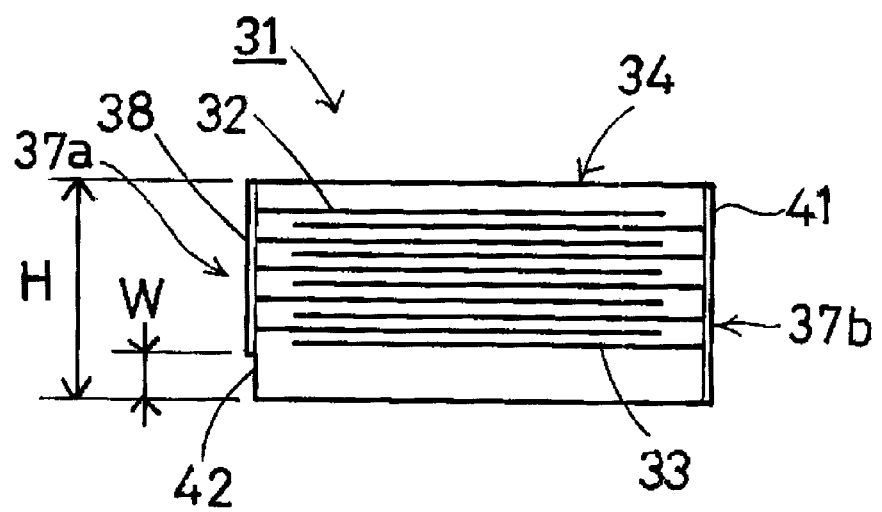
FIG. 14 is a horizontal sectional view of the structure of a driving section of the conventional multilayer piezoelectric device.
Figure 15A:
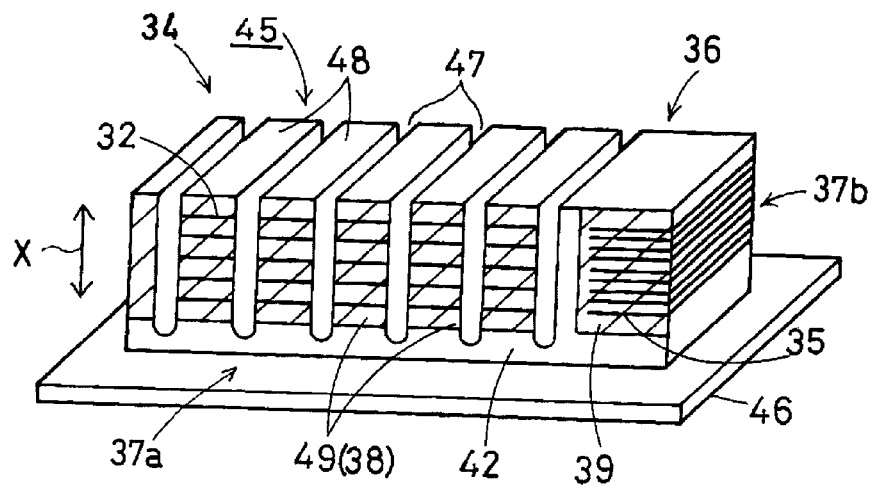
FIGS. 15A and 15B are perspective views of an external form of a piezoelectric actuator which is produced using the conventional multilayer piezoelectric device.
Figure 15B:
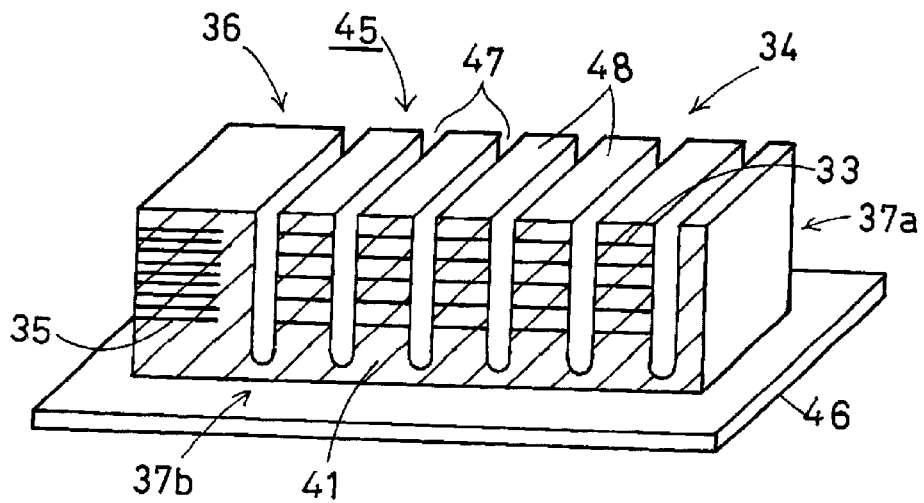
Figure 16:
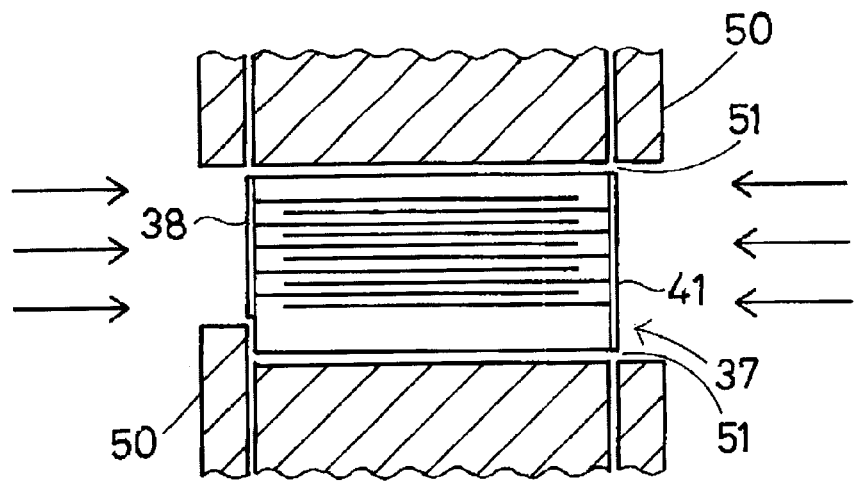
FIG. 16 illustrates a method of forming external electrodes in the conventional multilayer piezoelectric device.
Figure 17:
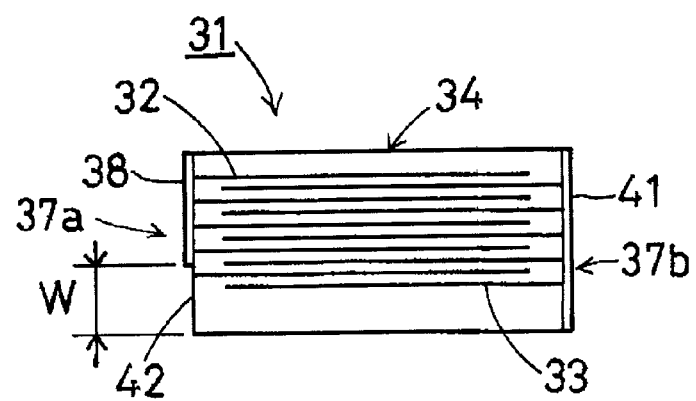
FIG. 17 illustrates a problem of the conventional multilayer piezoelectric device.
Figure 18:
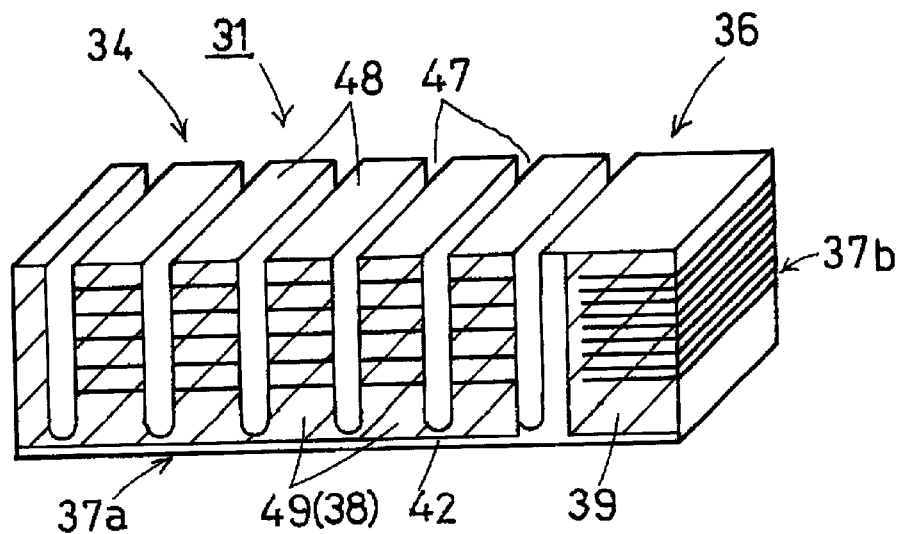
FIG. 18 illustrates another problem of the conventional multilayer piezoelectric device.
Figure 19:
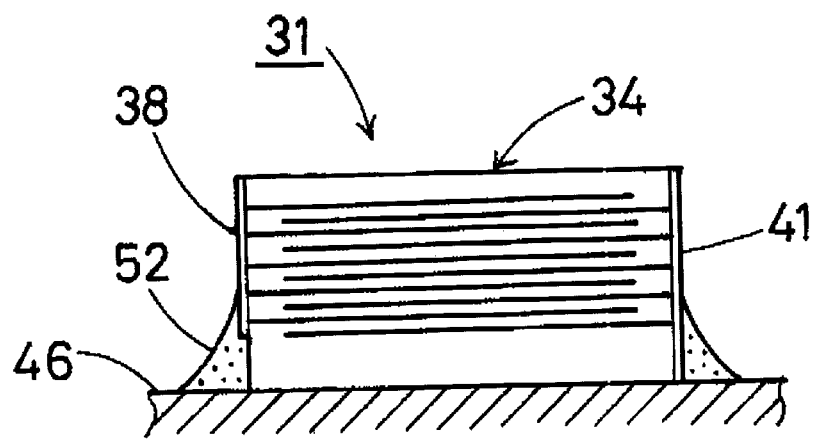
FIG. 19 illustrates still another problem of the conventional multilayer piezoelectric device.

The method of producing the multilayer piezoelectric device 1 is not limited to that described based on FIGS. 5 to 9, so that another method described below based on FIGS. 10 to 12 may be used. FIG. 10 illustrates another method of forming the driving-side external electrodes and the connection-side external electrodes in the multilayer piezoelectric device, according to another preferred embodiment of the present invention. FIG. 11 illustrates still another method of forming the driving-side external electrodes and the connection-side external electrodes in the multilayer piezoelectric device. FIG. 12 is an exploded perspective view of another method of producing the piezoelectric layered bodies themselves.

In the above-described method of producing the multilayer piezoelectric device 1, the parent substrate 15 where the piezoelectric layered bodies 37 to be separated are continuously formed in parallel is produced, and cut-in grooves 16, which become the cutaway portions 3 of their corresponding piezoelectric layered bodies 37, are formed in the corresponding areas that become the corresponding piezoelectric layered bodies 37 formed at the parent substrate 15. Then, after supporting the separated piezoelectric layered bodies in a tilted state, the driving-side external electrodes 38 and the connection-side external electrodes 39 are formed. In contrast, in a first modification of the method of producing the multilayer piezoelectric device 1, after producing the piezoelectric layered bodies 37 that have been separated by dividing the parent substrate 15 produced by subjecting the parent substrate block to a baking process, first, these piezoelectric layered bodies 37 are placed upon each other in a lamination direction as shown in FIG. 10.

Thereafter, the piezoelectric layered bodies 37 that have been placed upon each other are supported after causing the first side surfaces 37a of the corresponding piezoelectric layered bodies 37 to face the evaporation source 21. When materials suitable for forming the external electrodes are evaporated on the first side surfaces 37a of the corresponding piezoelectric layered bodies 37, the driving-side external electrodes 38 and the connection-side external electrodes 39 that are in electrical conduction with the first driving internal electrodes 32 and the connection-side internal electrodes 35, respectively, are formed. Then, with the piezoelectric layered bodies 37 placed upon each other, when the cut-in grooves 18 of predetermined depths are formed in the corresponding piezoelectric layered bodies 37, the cut-in grooves 18 become their corresponding cutaway portions 3 formed along the bottom end portions of their corresponding piezoelectric layered bodies 37. Here, the cut-in grooves 18 are formed by dicing or other suitable groove forming process.

In other words, in the first modification of the method of producing the multilayer piezoelectric device 1, after previously forming the driving-side external electrodes 38 and the connection-side external electrodes 39 that cover the entire first side surfaces 37a of the piezoelectric layered bodies 37, portions of these external electrodes 38 and 39 are removed in order to form the cutaway portions 3. Then, after forming the common-side electrode 41 at each second side surface 37b opposing its corresponding first side surface 37a where the driving-side external electrodes 38 and the connection-side external electrodes 39 are formed, when a voltage is applied between the driving-side external electrodes 38 and the connection-side external electrodes 39 in order to polarize the piezoelectric layers of the driving sections 34, the multilayer piezoelectric devices 1 are completed.

The external electrodes 38, 39, and 41 do not need to be formed by evaporation, so that, they may be formed by sputtering or screen printing. When this modification of the method of producing the multilayer piezoelectric device 1 is used, the driving-side external electrodes 38 and the connection-side external electrodes 39, to be formed over the entire side surfaces 37a of the corresponding piezoelectric layered bodies 37 excluding the cutaway portions 3, may be formed simultaneously on the plurality of superimposed piezoelectric layered bodies 37.

In a second modification of the method of producing the multilayer piezoelectric device 1, after producing the piezoelectric layered bodies 37 that have been separated by dividing the parent substrate 15 produced by subjecting the parent substrate block to a baking process, first, the piezoelectric layered bodies 37 are placed upon each other in the lamination direction. Then, by dicing or other suitable process, the cut-in grooves, which become the corresponding cutaway portions 3, are formed in the corresponding piezoelectric layered bodies 37 that are placed upon each other.

Thereafter, as shown in FIG. 11, after the piezoelectric layered bodies 37 placed upon each other which have been tilted by predetermined angles have been supported, when materials suitable for forming the external electrodes are adhered to the first surfaces 37a of the piezoelectric layered bodies 37 by evaporation, the driving-side external electrodes 38 and the connection-side external electrodes 39 that are in electrical conduction with the first driving internal electrodes 32 and the connection internal electrodes 35, respectively, are formed. More specifically, in the piezoelectric bodies 37 at this time, the cutaway portions 3 are moved away from the evaporation source 21 and the first side surfaces 37a are supported in a tilted state so as to face the evaporation source 21.

Then, after forming the common-side external electrode 41 at each second side surface 37b opposing its corresponding first side surface 37a where the driving-side external electrodes 38 and the connection-side external electrodes 39 are formed, when a voltage is applied between the driving-side external electrodes 38 and the connection-side external electrodes 39 in order to polarize the piezoelectric layers of the driving sections 34, the multilayer piezoelectric devices 1 are completed. The external electrodes 38, 39, and 41 do not have to be formed by evaporation, so that, they may be formed by sputtering or by other suitable process.

Although, in the method of producing the multilayer piezoelectric device 1 described with reference to FIG. 5, the first and second driving internal electrodes 32 and 33 and the connecting internal electrodes 35 are formed in a separated state, the electrodes 32, 33, and 35 do not have to be formed in a previously separated state when producing the piezoelectric actuator 2. Hereafter, a modification of the method of forming the electrodes will be described.

The electrically conductive pattern 8, which defines the first driving internal electrode 32, and the electrically conductive pattern 9, which defines the corresponding connecting internal electrodes 35, are formed in a separated state on the green sheet 5 shown in FIG. 5. The electrically conductive pattern 10, which becomes the second driving internal electrodes 33, and the electrically conductive pattern 9, which becomes the corresponding connecting internal electrodes 35, are formed in a separated state on the green sheet 6 shown in FIG. 5. However, the electrically conductive patterns 8 and 9 and the electrically conductive patterns 9 and 10 do not have to be formed initially in a separated state. For example, as shown in FIG. 12, an electrically conductive pattern 19 having a shape that is formed by integrally forming the first driving internal electrodes 32 and the connecting internal electrodes 35 may be disposed on the green sheet 5, and an electrically conductive pattern 20 having a shape that is formed by integrally forming the second driving internal electrodes 33 and the connecting internal electrodes 35 may be disposed on the green sheet 6.

More specifically, in producing the piezoelectric actuator 2 from the multilayer piezoelectric device 1, the plurality of slits 47 are formed along the lamination direction X from the top surface to the bottom surface of the driving section 34 of the piezoelectric layered body 37. Portions between the driving section 34 and the connecting section 36 may be divided at the same time. When portions between the driving section 34 and the connecting section 36 are divided, portions between the connecting internal electrodes 35 and the first and second driving internal electrodes 32 and 33, which are initially integrally formed, are divided. Accordingly, the electrodes 32, 33, and 35 become separate electrodes, which are the same as those shown in FIG. 5.

As described above, in the multilayer piezoelectric device, the connection-side external electrodes and the driving-side external electrodes, which define unit external electrodes of the piezoelectric actuator, are constructed so as to be reliably separated by a predetermined interval from the bottom surface of the piezoelectric layered body through the cutaway portion, that is, by an interval which matches the depth of the cutaway portion. Therefore, the heights of the portions where the driving-side external electrodes and the connection-side external electrodes are disposed are not increased or decreased, so that faulty electrical continuity between the external electrodes and the driving internal electrodes in the multilayer piezoelectric device and a short circuit between the unit external electrodes in the piezoelectric actuator do not occur.

When a cutaway portion is formed in one side surface of the piezoelectric layered body of the multilayer piezoelectric device, a fillet of an adhesive for securing the multilayer piezoelectric device to a supporting substrate accumulates inside the cutaway portion, thereby providing the advantage that the fillet does not ooze out to the surface of the driving-side external electrodes and the connection-side external electrodes. Therefore, it becomes easy to solder a flexible printed circuit to the unit external electrodes of the piezoelectric actuator. In addition, when a cutaway portion is formed in one side surface of the piezoelectric layered body, the lower external layer portion of the multilayer piezoelectric device can be thin, thereby increasing mechanical processability and making it difficult for the multilayer piezoelectric device to be damaged.

When any one of the methods of producing a multilayer piezoelectric device of various preferred embodiments of the present invention is used, a cutaway portion of the piezoelectric layered body of the multilayer piezoelectric device can be very easily formed. In addition, the driving side external electrodes and the connection-side external electrodes to be formed over the entire side surfaces of a plurality of piezoelectric layered bodies excluding the cutaway portions can be formed simultaneously on the plurality of piezoelectric layered bodies, so that it is possible to increase productivity.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A multilayer piezoelectric device comprising:
a piezoelectric layered body including a driving section having first driving internal electrodes and second driving internal electrodes being alternately stacked upon each other with a piezoelectric layer disposed therebetween and a connecting section having connecting internal electrodes being stacked upon each other in a stacking direction with a piezoelectric layer disposed therebetween, at least a driving-side external electrode and a connection-side external electrode, which are in electrical conduction with the first driving internal electrodes and the connecting internal electrodes, respectively, are arranged substantially parallel to each other and on one of opposing side surfaces of the piezoelectric layered body, and at least a common-side external electrode, which is in electrical conduction with the second driving internal electrodes and the connecting internal electrodes, is disposed on the other side surface of the piezoelectric layered body;

wherein a plurality of separately drivable actuator units are defined by a slit that divides the first and second driving internal electrodes of the driving section, the slit extending along the stacking direction from a top surface to a bottom surface of the driving section, and a cutaway portion is formed in the one side surface of the piezoelectric layered body where the driving-side external electrode and the connection-side external electrode are arranged substantially in parallel to each other so that the cutaway portion is substantially parallel to the driving internal electrodes and the connecting internal electrodes, the cutaway portion having a depth that allows the cutaway portion to extend from a bottom surface of the piezoelectric layered body to a location above a bottom end of the slit but does not allow the cutaway portion to reach the driving internal electrodes.

2. A multilayer piezoelectric device according to claim 1, wherein the piezoelectric layered body is a substantially rectangular ceramic sintered body.

3. A multilayer piezoelectric device according to claim 1, wherein the driving-side external electrode and the connection-side external electrode are disposed to cover the entire portion of the one of the opposing side surfaces of the piezoelectric layered body except for the cutaway portion.

4. A multilayer piezoelectric device according to claim 1, wherein end portions of the first driving internal electrodes are exposed from only one of the opposing side surfaces of the piezoelectric layered body.

5. A multilayer piezoelectric device according to claim 1, wherein the connecting section extends to both of the opposing sides of the piezoelectric layered body.

6. A multilayer piezoelectric device according to claim 1, wherein end portions of the second driving internal electrodes are exposed from only one of the opposing sides of the piezoelectric body.

7. A multilayer piezoelectric device according to claim 1, wherein end portions of each of the connecting internal electrodes are exposed from both of the opposing side surfaces of the piezoelectric layered body.

8. A multilayer piezoelectric device according to claim 1, wherein a plurality of slits are formed in the driving section.

9. A multilayer piezoelectric device according to claim 8, wherein the slits extend in the stacking direction.

10. An apparatus comprising:

a multilayer piezoelectric device according to claim 1;

a supporting substrate; and an adhesive that secures the multilayer piezoelectric device to the substrate, wherein the adhesive is disposed at least partially in the cutaway portion.

11. A piezoelectric actuator comprising:

the multilayer piezoelectric device of claim 1;

a plurality of separately drivable actuator units that are defined by the slit that divides the first driving internal electrodes and the second driving internal electrodes in the driving section;

wherein the driving section of the piezoelectric device is divided by the slit extending along the stacking direction from the top surface to the bottom surface of the driving section.

* * * * *